US011239252B2

(12) United States Patent
Dorhout et al.

(10) Patent No.: US 11,239,252 B2
(45) Date of Patent: *Feb. 1, 2022

(54) INTEGRATED STRUCTURES INCLUDING MATERIAL CONTAINING SILICON, NITROGEN, AND AT LEAST ONE OF CARBON, OXYGEN, BORON AND PHOSPHORUS

(71) Applicant: Micron Technology, Inc., Boise, ID (US)

(72) Inventors: Justin B. Dorhout, Boise, ID (US); Fei Wang, Boise, ID (US); Chet E. Carter, Boise, ID (US); Ian Laboriante, Boise, ID (US); John D. Hopkins, Meridian, ID (US); Kunal Shrotri, Boise, ID (US); Ryan Meyer, Boise, ID (US); Vinayak Shamanna, Boise, ID (US); Kunal R. Parekh, Boise, ID (US); Martin C. Roberts, Boise, ID (US); Matthew Park, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/907,967

(22) Filed: Jun. 22, 2020

(65) Prior Publication Data
US 2020/0321352 A1    Oct. 8, 2020

Related U.S. Application Data

(63) Continuation of application No. 16/158,039, filed on Oct. 11, 2018, now Pat. No. 10,720,446, which is a (Continued)

(51) Int. Cl.
*H01L 29/792* (2006.01)
*H01L 27/11582* (2017.01)
(Continued)

(52) U.S. Cl.
CPC ...... *H01L 27/11582* (2013.01); *H01L 23/528* (2013.01); *H01L 23/53257* (2013.01); *H01L 27/1157* (2013.01)

(58) Field of Classification Search
CPC ......... H01L 27/11582; H01L 23/53257; H01L 23/528
See application file for complete search history.

(56) References Cited

U.S. PATENT DOCUMENTS 6,949,829 B2    9/2005 Akahori et al.
7,226,845 B2 *  6/2007 Manning .......... H01L 27/10852
                                                    257/296
(Continued)

FOREIGN PATENT DOCUMENTS

TW    530380    5/2003
TW    106112981    11/2017
(Continued)

*Primary Examiner* — Dale E Page
*Assistant Examiner* — Wilner Jean Baptiste
(74) *Attorney, Agent, or Firm* — Wells St. John P.S.

(57) ABSTRACT

Some embodiments include an integrated structure having vertically-stacked conductive levels alternating with dielectric levels. A layer over the conductive levels includes silicon, nitrogen, and one or more of carbon, oxygen, boron and phosphorus. In some embodiments the vertically-stacked conductive levels are wordline levels within a NAND memory array. Some embodiments include an integrated structure having vertically-stacked conductive levels alternating with dielectric levels. Vertically-stacked NAND memory cells are along the conductive levels within a memory array region. A staircase region is proximate the memory array region. The staircase region has electrical contacts in one-to-one correspondence with the conductive levels. A layer is over the memory array region and over the staircase region. The layer includes silicon, nitrogen, and one or more of carbon, oxygen, boron and phosphorus.

6 Claims, 3 Drawing Sheets

Related U.S. Application Data continuation of application No. 15/133,119, filed on Apr. 19, 2016, now Pat. No. 10,157,933.

(51) Int. Cl.
  *H01L 27/1157* (2017.01)
  *H01L 23/528* (2006.01)
  *H01L 23/532* (2006.01)

(56) References Cited

U.S. PATENT DOCUMENTS

| | | | |
|---|---|---|---|
| 10,157,933 B2* | 12/2018 | Dorhout | H01L 27/1157 |
| 2004/0041266 A1 | 3/2004 | Akahori et al. | |
| 2008/0108193 A1 | 5/2008 | You et al. | |
| 2010/0140684 A1 | 6/2010 | Ozawa | |
| 2011/0049607 A1 | 3/2011 | Yahashi | |
| 2013/0161731 A1 | 6/2013 | Bin et al. | |
| 2013/0164922 A1 | 6/2013 | Cho et al. | |
| 2015/0194441 A1 | 7/2015 | Yatsuda et al. | |
| 2015/0236038 A1 | 8/2015 | Pachamuthu et al. | |
| 2015/0364488 A1 | 12/2015 | Pachamathu et al. | |
| 2015/0372005 A1 | 12/2015 | Yon et al. | |
| 2016/0071861 A1 | 3/2016 | Serov et al. | |
| 2016/0086972 A1 | 3/2016 | Zhang et al. | |
| 2016/0260735 A1 | 9/2016 | Lee et al. | |
| 2016/0315095 A1 | 10/2016 | Sei et al. | |
| 2016/0379989 A1 | 12/2016 | Sharangpani et al. | |

FOREIGN PATENT DOCUMENTS

| | | |
|---|---|---|
| WO | WO PCT/US2017/027995 | 8/2017 |
| WO | WO PCT/US2017/027995 | 10/2018 |

* cited by examiner

INTEGRATED STRUCTURES INCLUDING MATERIAL CONTAINING SILICON, NITROGEN, AND AT LEAST ONE OF CARBON, OXYGEN, BORON AND PHOSPHORUS

RELATED PATENT DATA

This patent resulted from a continuation of U.S. patent application Ser. No. 16/158,039 filed Oct. 11, 2018, which is a continuation of U.S. patent application Ser. No. 15/133,119 filed Apr. 19, 2016, each of which is incorporated by reference herein.

TECHNICAL FIELD

Integrated structures including material containing silicon, nitrogen, and at least one of carbon, oxygen, boron and phosphorus.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture.

DETAILED DESCRIPTION OF THE ILLUSTRATED EMBODIMENTS

Some embodiments include integrated circuit constructions having a material containing silicon, nitrogen and at least one of carbon, oxygen, boron and phosphorus. The material may extend across a memory array region. In some embodiments the memory array region comprises vertically-stacked wordline levels which extend to a staircase region (also sometimes referred to as a stepped region, shark jaw region, etc.) where conductive contacts are extended to individual wordline levels. In some embodiments the material may extend across one or both of the memory array region and the staircase region. The material may provide numerous advantages. For instance, the material may provide an insulative barrier to protect underlying conductive levels in the event of mask misalignment during fabrication of conductive contacts to regions over and/or near the conductive levels. As another example, the material may be fabricated to have compressive/tensile stress properties which compensate for stresses of underlying materials to alleviate bending and/or other undesired contortion of an integrated circuit die. Example embodiments are described with reference to FIGS. 1-3.

Figure 1:
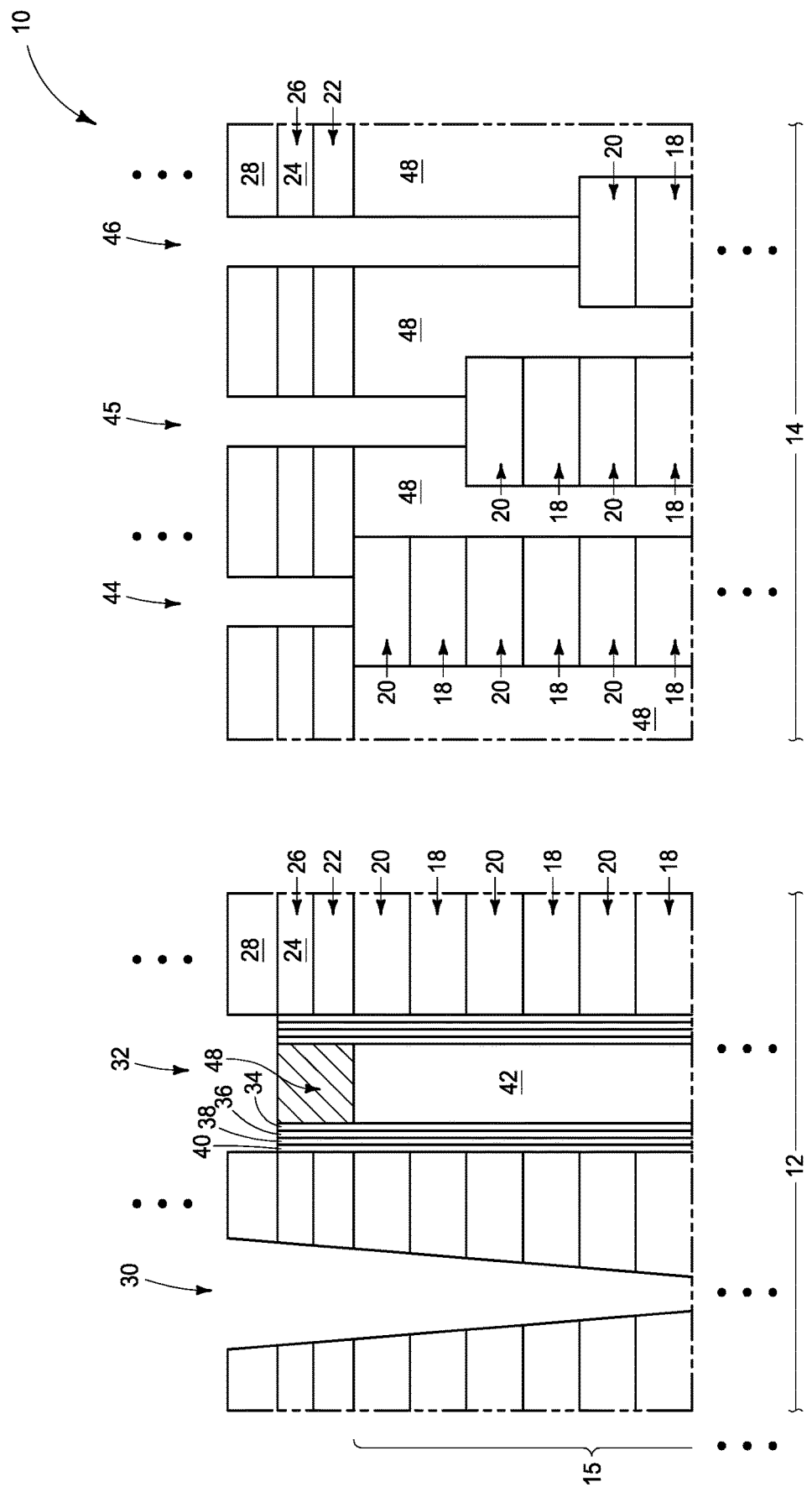
FIG. 1 is a diagrammatic cross-sectional view illustrating regions of an integrated construction at a processing stage of an example embodiment.

Referring to FIG. 1, portions of a construction 10 are illustrated, with such portions corresponding to integrated structures. One of the portions is a fragment of a memory array region 12 and the other is a fragment of a staircase region 14.

A stack 15 of alternating levels 18 and 20 extends across the regions 12 and 14. The levels 18 may comprise dielectric material, such as, for example, silicon dioxide. The levels 20 may comprise sacrificial (i.e., replaceable) material, such as, for example, silicon nitride. The levels 18 and 20 may have any suitable thicknesses. The levels 18 and 20 may be the same thickness as one another in some embodiments, and may differ in thickness relative to one another in other embodiments.

An insulative region 22 is over the uppermost level 20. Such insulative region may comprise any suitable insulative composition or combination of insulative compositions; including, for example, silicon dioxide. Although the region 22 is shown to comprise a single homogeneous composition, in other embodiments the region 22 may comprise two or more discrete compositions.

A layer 26 is over the insulative region 22, and such layer is composed of a material 24. Material 24 comprises silicon, nitrogen and one or more substances selected from the group consisting of carbon, oxygen, boron and phosphorus. In some embodiments a total concentration of carbon, oxygen, boron and/or phosphorus within material 24 is at least about 2 atomic percent, at least about 4 atomic percent, at least about 10 atomic percent, etc. In some embodiments a total concentration of carbon, oxygen, boron and/or phosphorus within the material 24 is within a range of from about 2 atomic percent to about 20 atomic percent; within a range of from about 6 atomic percent to about 11 atomic percent, etc. In some embodiments, the material 24 may consist of silicon, nitrogen and one or more of carbon, oxygen, boron and phosphorus.

An advantage of including carbon, oxygen, boron and/or phosphorus within the silicon nitride material 24 is that such can render material 24 resistant to etching subsequently utilized to remove sacrificial silicon nitride within levels 20 (discussed below with reference to FIG. 2). Accordingly, it can be desired that the total concentration of carbon, oxygen, boron and/or phosphorus within silicon nitride material 24 be sufficient to render the material 24 resistant to the etch utilized to remove silicon nitride (or other suitable replaceable material) within levels 20. It can also be desired that material 24 be nonconductive. Accordingly, it can be desired that the concentration of substances included within the silicon nitride of material 24 (for instance, carbon) be kept low enough so that the silicon nitride material 24 remains nonconductive. The silicon nitride material 24 may be referred to as an "enhanced silicon nitride material" to indicate that the silicon nitride material comprises a composition tailored for advantages relative to silicon nitride alone.

Patterned material 28 is provided over the enhanced silicon nitride material 24. The patterned material 28 may comprise any suitable composition or combination of compositions, and in some embodiments will comprise dielectric material, such as, for example, silicon dioxide.

Dots are provided above and below the illustrated portions of construction 10 to indicate that there may be multiple additional levels or other structures above and below the illustrated portions. Also, dots are provided at the lower end of the bracket illustrating stack 15 to indicate that the stack may extend below the illustrated portion. A select gate level, source line, etc., may be below the illustrated portions of construction 10 in some embodiments.

In some embodiments the illustrated portions of construction 10 would be supported by a semiconductor substrate; which may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

First and second openings 30 and 32 extend through stack 15 within memory array region 12.

The first opening 30 represents one of a plurality of slits utilized to subdivide a memory array into programmable blocks. In some embodiments the individual blocks may correspond to smallest units within the memory array which may be erased, and each block may contain a number of pages which correspond to the smallest units which may be programmed.

The second opening 32 represents a region where vertically-stacked memory cells are formed. Channel material 34 is within opening 32, and is spaced from materials of stack 15 by dielectric material 36, charge-storage material 38 and charge-blocking material 40. The materials 34, 36, 38 and 40 may comprise any suitable compositions or combinations of compositions. For instance, channel material 34 may comprise appropriately-doped silicon; dielectric material 36 may comprise one or more of silicon dioxide, hafnium oxide, aluminum oxide, zirconium oxide, etc.; charge-storage material 38 may comprise one or more charge-trapping materials, such as silicon nitride, silicon oxynitride, metal dots, etc.; and charge-blocking material 40 may comprise one or more of silicon dioxide, aluminum oxide, hafnium oxide, zirconium oxide, etc.

The illustrated channel material 34 lines sidewalls of opening 32 to leave a central region filled with dielectric material 42. Such corresponds to a so-called hollow channel configuration. In other embodiments the channel material may fill a central region of opening 32 as a solid pillar. The dielectric material 42 may comprise any suitable composition, such as, for example, oxide (e.g., silicon dioxide).

A conductive plug 48 is provided over dielectric material 42. The conductive plug 48 may comprise any suitable composition or combination of compositions; including, for example, one or more of conductively-doped semiconductor material (for instance, conductively-doped silicon, conductively-doped germanium, etc.), metal (for instance, tungsten, titanium, etc.), and metal-containing compositions (for instance, metal nitride, metal carbide, etc.).

The first and second openings 30 and 32, and the structures within opening 32, are representative of numerous openings and structures that may be formed across a memory array.

First, second and third openings 44-46 extend through various materials of the staircase region 14. Each opening extends to a different one of the levels 20, and ultimately is utilized to form an electrical contact extending to the exposed level. Dielectric material 48 is provided within the staircase region adjacent pedestals comprising the alternating levels 18 and 20. The dielectric material 48 may comprise any suitable composition or combination of compositions, including, for example, oxide (such as silicon dioxide).

All of the openings 30, 32 and 44-46 are shown formed at a common processing stage in FIG. 1 in order to simplify description of advantages of the enhanced silicon nitride material 24. In practice, one or more of the openings 30, 32 and 44-46 may be formed at a different processing stage relative to others of the openings.

Figure 2:
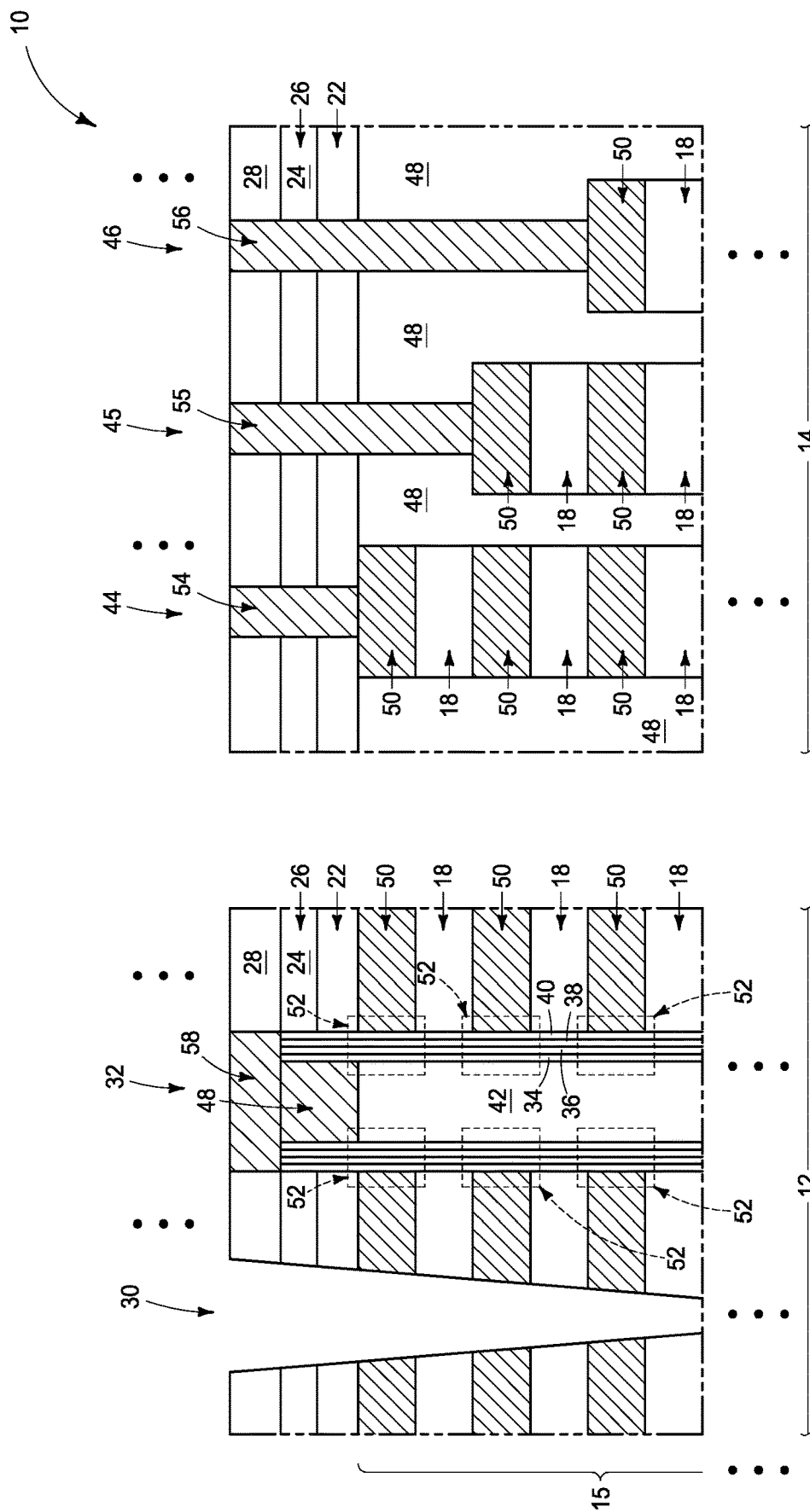
FIG. 2 is a diagrammatic cross-sectional view illustrating the regions of FIG. 1 at an example embodiment processing stage subsequent to that of FIG. 1.

Referring to FIG. 2, the sacrificial material of levels 20 (FIG. 1) is removed and replaced by conductive material to form conductive levels 50. The conductive material of levels 50 may comprise any suitable composition or combination of compositions; and may, for example, comprise, consist essentially of, or consist of one or more of conductively-doped semiconductor material(s), metal(s), or metal-containing composition(s). In some embodiments, the conductive material of levels 50 may comprise, consist essentially of, or consist of tantalum or tungsten.

Conductive levels 50 may be referred to as vertically-stacked conductive levels which alternate with dielectric levels 18. In some embodiments, the conductive levels 50 may be referred to as vertically-stacked NAND wordline levels.

A NAND memory array may be formed across the memory array region 12. Such NAND memory array comprises vertically-stacked memory cells, with some example memory cells 52 being diagrammatically illustrated in FIG. 2. The memory cells comprise regions of conductive levels 50 as control gate material, and comprise regions of the channel material 34, dielectric material 36, charge-storage material 38 and charge-blocking material 40.

Conductive interconnects 54-56 are formed within the openings 44-46 across staircase region 14. The conductive interconnects 54-56 are in one-to-one correspondence with the conductive levels (i.e. wordline levels) 50 and connect specific wordline levels with other circuitry (not shown). Such other circuitry may be utilized to, for example, trigger specific wordline levels during programming, erasing and/or reading operations. The conductive interconnects 54-56 may comprise any suitable electrically conductive compositions or combinations of compositions; and may, for example, comprise, consist essentially of, or consist of one or more of conductively-doped semiconductor material(s), metal(s), or metal-containing composition(s).

The enhanced silicon nitride material 24 extends across the memory cells 52 of the NAND memory array, and also extends across the staircase region 14. The enhanced silicon nitride material 24 remains after replacement of silicon nitride of levels 20 (FIG. 1) due to the incorporation of one or more of carbon, oxygen, boron and phosphorus within the enhanced silicon nitride material. The enhanced silicon nitride material 24 may advantageously provide compressive/tensile stress characteristics which balance the stresses of underlying materials to enhance planarity of an integrated circuit die relative to a conventional die lacking enhanced silicon nitride material 24. Further, relative amounts of carbon, oxygen, boron and/or phosphorus within the enhanced silicon nitride material 24 may be tailored to achieve tensile/compressive stress characteristics suitable for specific applications.

In the illustrated embodiment, the enhanced silicon nitride material 24 is spaced from an uppermost conductive level 50 by only the single dielectric region 22. Such may simplify processing as compared to other constructions in which enhanced silicon nitride material 24 is spaced from the uppermost conductive level by additional materials.

A conductive interconnect 58 is shown provided within opening 32 to electrically connect with channel material 34 and conductive plug 48. Such interconnect may electrically connect the channel material 34 with other circuitry (not shown). The interconnect 58 may comprise any suitable electrically conductive composition or combination of compositions; and may, for example, comprise, consist essentially of, or consist of one or more of conductively-doped semiconductor material(s), metal(s), or metal-containing composition(s).

Figure 3:
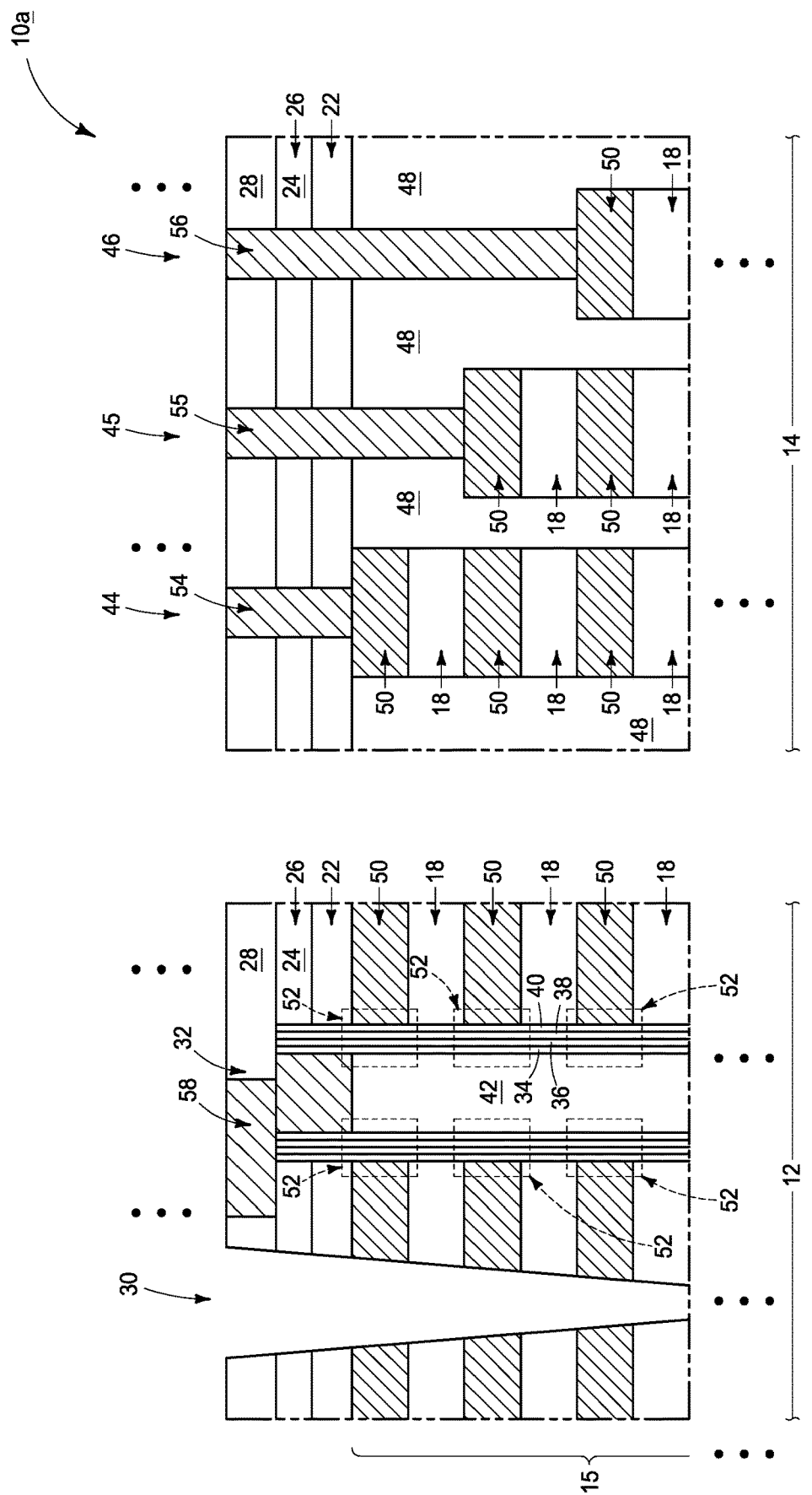
FIG. 3 is a diagrammatic cross-sectional view illustrating regions similar to those of FIG. 1 at another example embodiment processing stage subsequent to that of FIG. 1.

In the illustrated embodiment of FIG. 2, the interconnect 58 is appropriately aligned with underlying materials. However, in some applications there may be misalignment of the interconnect 58 due to, for example, misalignment of a mask utilized to pattern an opening for interconnect 58. FIG. 3 shows a construction 10a analogous to the construction of FIG. 2, but having the interconnect 58 misaligned. Advantageously, the enhanced silicon nitride material 24 protects the underlying dielectric region 22 from being compromised during formation of the misaligned opening for interconnect 58, and thus avoids a problematic short that could otherwise occur between the conductive material of interconnect 58 and the uppermost conductive level 50.

Although various embodiments are described above with reference to NAND architectures, it is to be understood that aspects of the invention(s) described herein may extend to architectures other than NAND. Such other architectures may include memory architectures, logic architectures, etc.

The constructions discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure comprising vertically-stacked conductive levels alternating with dielectric levels. A layer over the conductive levels comprises silicon, nitrogen, and one or more substances selected from the group consisting of carbon, oxygen, boron and phosphorus; wherein a total concentration of said one or more substances is within a range of from about 2 atomic percent to about 20 atomic percent.

Some embodiments include an integrated structure comprising vertically-stacked NAND wordline levels within a NAND memory array. A layer over the wordline levels comprises silicon, nitrogen, and one or more substances selected from the group consisting of carbon, oxygen, boron and phosphorus; wherein a total concentration of said one or more substances is at least about 2 atomic percent. The layer is spaced from an uppermost of the wordline levels by no more than one insulative region.

Some embodiments include an integrated structure comprising vertically-stacked conductive levels alternating with dielectric levels. Vertically-stacked NAND memory cells are along the conductive levels within a memory array region. A staircase region is proximate the memory array region. The staircase region comprises electrical contacts in one-to-one correspondence with the conductive levels. A layer is over the memory array region and over the staircase region. The layer comprises silicon, nitrogen, and one or more substances selected from the group consisting of carbon, oxygen, boron and phosphorus; wherein a total concentration of said one or more substances is within a range of from about 2 atomic percent to about 20 atomic percent.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
 a vertically-stack comprising conductive levels alternating with dielectric levels;
 vertically-stacked NAND memory cells along the conductive levels within a memory array region;

a silicon nitride material over the memory array region, the material being separated by an uppermost of the conductive levels by an intervening insulative material; the silicon nitride material comprising silicon, nitrogen, and one or more substances selected from the group consisting of carbon, oxygen, boron and phosphorus;

a first opening within the memory array region extending through the silicon nitride material over the memory array region and through at least some of the vertically-stacked conductive levels;

a channel material within the first opening; and a second opening spaced from the first opening by regions of the stack, the second opening having sidewalls comprising the silicon nitride material, the insulative material, conductive material of the conductive levels and dielectric material of the dielectric levels, the second opening subdividing the memory array region into programmable blocks.

2. The integrated structure of claim 1 wherein said total concentration of the one or more substances is within a range of from about 6 atomic percent to about 11 atomic percent.

3. The integrated structure of claim 1 wherein said one or more substances include carbon.

4. The integrated structure of claim 1 wherein said one or more substances include oxygen.

5. The integrated structure of claim 1 wherein said one or more substances include boron.

6. The integrated structure of claim 1 wherein said one or more substances include phosphorus.

* * * * *